(12) United States Patent
Guyette

(10) Patent No.: US 11,271,541 B2
(45) Date of Patent: Mar. 8, 2022

(54) MICROWAVE DUPLEXER USING COUPLED INDUCTORS TO IMPROVE ISOLATION

(71) Applicant: Resonant Inc., Goleta, CA (US)

(72) Inventor: Andrew Guyette, San Mateo, CA (US)

(73) Assignee: Resonant Inc., Austin, TX (US)

( * ) Notice: Subject to any disclaimer, the term of this patent is extended or adjusted under 35 U.S.C. 154(b) by 137 days.

(21) Appl. No.: 16/355,288

(22) Filed: Mar. 15, 2019

(65) Prior Publication Data

US 2020/0295733 A1    Sep. 17, 2020

(51) Int. Cl.
| | |
|---|---|
| *H03H 9/05* | (2006.01) |
| *H03H 9/72* | (2006.01) |
| *H03H 9/70* | (2006.01) |
| *H03H 9/54* | (2006.01) |
| *H03H 9/46* | (2006.01) |
| *H03H 9/48* | (2006.01) |
| *H03H 7/09* | (2006.01) |

(52) U.S. Cl.
CPC .......... *H03H 9/0566* (2013.01); *H03H 9/462* (2013.01); *H03H 9/485* (2013.01); *H03H 9/54* (2013.01); *H03H 9/542* (2013.01); *H03H 9/706* (2013.01); *H03H 9/725* (2013.01); *H03H 7/09* (2013.01)

(58) Field of Classification Search
CPC ...... H03H 9/0566; H03H 9/462; H03H 9/485; H03H 9/54; H03H 9/706; H03H 9/725; H03H 7/09; H03H 9/542
USPC ...................................... 333/133; 455/78, 82
See application file for complete search history.

(56) References Cited

U.S. PATENT DOCUMENTS

| | | | | |
|---|---|---|---|---|
| 6,909,338 | B2* | 6/2005 | Omote | H03H 9/542 333/133 |
| 7,479,846 | B2* | 1/2009 | Inoue | H03H 9/0576 333/133 |
| 7,733,197 | B2* | 6/2010 | Itou | H03H 9/725 333/133 |
| 7,941,103 | B2 | 5/2011 | Iwamoto et al. | |
| 8,378,760 | B2* | 2/2013 | Iwaki | H03H 9/0576 333/129 |
| 2005/0070332 | A1* | 3/2005 | Yamato | H03H 9/706 455/562.1 |
| 2010/0244979 | A1* | 9/2010 | Matsuda | H03H 9/0571 333/100 |
| 2011/0018654 | A1 | 1/2011 | Bradley et al. | |

(Continued)

FOREIGN PATENT DOCUMENTS

JP        2010-192974 A   *  9/2010

OTHER PUBLICATIONS

English language machine translation of JP 2010-192974 A, published Sep. 2, 2010, 18 pages (Year: 2010).*

*Primary Examiner* — Barbara Summons
(74) *Attorney, Agent, or Firm* — SoCal IP Law Group LLP; Angelo Gaz

(57) ABSTRACT

A duplexer includes a duplexer package having a transmit terminal, an antenna terminal, a receive terminal and at least one package ground terminal, a transmit filter disposed within the duplexer package, and a receive filter disposed within the duplexer package. Coupled first and second inductors, the first inductor connected to the transmit filter and the second inductor connected to the receive filter, are configured to cancel, at least in part, RF signal leakage between the transmit filter and the receive filter.

14 Claims, 13 Drawing Sheets

© 2019 Resonant Inc

(56) References Cited

U.S. PATENT DOCUMENTS

| | | | |
|---|---|---|---|
| 2011/0254639 A1* | 10/2011 | Tsutsumi | H03H 9/70 |
| | | | 333/132 |
| 2012/0194298 A1* | 8/2012 | Maurer | H03H 9/605 |
| | | | 333/189 |
| 2015/0042417 A1 | 2/2015 | Onodera et al. | |
| 2017/0077896 A1* | 3/2017 | Sugaya | H03H 7/38 |
| 2017/0222617 A1 | 8/2017 | Mizoguchi | |
| 2018/0062615 A1 | 3/2018 | Kato et al. | |
| 2018/0337706 A1* | 11/2018 | Yamazaki | H04B 1/50 |

* cited by examiner $V_{GR} = j\omega[L_{GR}I_{GR} + L_C(I_{GR}+I_{GT}) + L_M I_{GT}]$ $V_{GR} = j\omega I_{GR}(L_{GR}+L_C)$ if $L_M = -L_C$ $V_{GR} = j\omega[L_{GR}I_{GR} + L_C(I_{GR}+I_{GT})]$ © 2019 Resonant Inc

MICROWAVE DUPLEXER USING COUPLED INDUCTORS TO IMPROVE ISOLATION

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using electro-mechanical resonators.

Description of the Related Art

An electro-mechanical resonator is a device that couples an electrical signal between an input and an output by means of mechanical motion. Typically, an electro-mechanical resonator converts an input signal into mechanical motion in a substrate or other structure and then converts the mechanical motion into an output signal. The coupling between the input and output of an electro-mechanical resonator is highly frequency dependent and may exhibit both a resonance where the impedance between the input and output approaches zero and an anti-resonance where the admittance between the input and output approaches zero. Examples of electro-mechanical resonators include surface acoustic wave (SAW) resonators, bulk acoustic wave (BAW) resonators, film bulk acoustic wave (FBAR) resonators, and micro-electro-mechanical system (MEMS) resonators. Throughout this patent, the term "resonator" means an electro-mechanical resonator of any type unless otherwise specified.

A radio frequency (RF) filter is a two-terminal device configured to pass some frequencies and to stop other frequencies, where "pass" means transmit with relatively low insertion loss and "stop" means block or substantially attenuate. The range of frequencies passed by a filter is referred to as the "passband" of the filter. The range of frequencies stopped by such a filter is referred to as the "stopband" of the filter. A typical RF filter has at least one passband and at least one stopband. Specific requirements on a passband or stopband depend on the specific application. For example, a "passband" may be defined as a frequency range where the insertion loss of a filter is less than a defined value such as one dB, two dB, or three dB. A "stopband" may be defined as a frequency range where the insertion loss of a filter is greater than a defined value such as twenty dB, twenty-five dB, forty dB, or greater depending on application. A "multiple-passband" filter is a filter that provides multiple noncontiguous passbands separated by stopbands. For example, a dual-passband filter has two disjoint frequency ranges with low insertion loss separated by a stopband having high insertion loss.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Electro-mechanical resonators are used in a variety of RF filters including band-reject filters, band-pass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than two input or output ports with multiple passbands. A triplexer is a four-port multiplexer with three passbands.

RF filters typically require many design trade-offs to achieve, for each specific application, the best compromise between such performance parameters as insertion loss, rejection, isolation, power handling, linearity, size and cost. Specific design and manufacturing methods and enhancements can benefit simultaneously one or several of these requirements. With the explosive growth of wireless communication and the appearance of new frequency bands for LTE® (Long Term Evolution) networks, the frequency spectrum has become very crowded, driving the need for duplexers and filters with steeper roll-off at the edges of the filter pass-band and low thermal drift to reduce the gap between frequency bands and to extend the efficiency of use of the available bandwidth.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

Figure 1:
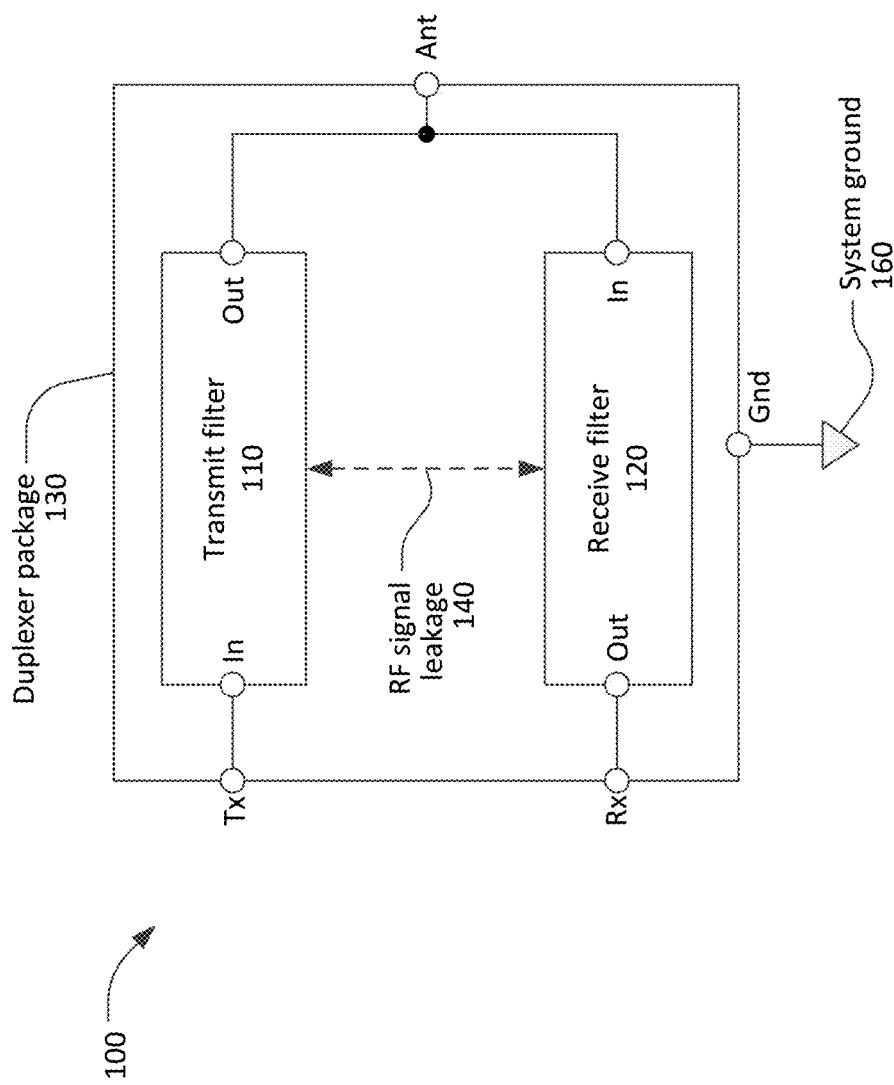
FIG. 1 is a block diagram of a duplexer.

Referring now to FIG. 1, a duplexer 100 includes a transmit filter 110 and a receive filter 120. The transmit filter 110 and the receive filter 120 may be a single device or may be two physically separate devices. In either case, the transmit filter 110 and the receive filter 120 are mounted with a common duplexer package 130.

The transmit filter 110 has an input (In) connected to a transmit (Tx) port and an output (Out) connected to an antenna (Ant) port of the duplexer 100. The transmit filter 110 is configured to pass signals within a transmit frequency band from a transmitter connected to the Tx port to an antenna connected to the Ant port. The receive filter 120 has an input connected to the Ant port and an output connected to a receive (Rx) port of the duplexer 100. The receive filter 120 is configured to pass signals within a receive frequency band from the antenna to a receiver connected to the Rx port. An important function of a duplexer is to provide high isolation (i.e. very low transmittance) between the Tx port and the Rx port, particularly for the transmit frequency band.

The receive filter 120 and the transmit filter 110 may be designed to have very low transmittance for signals in one or more stopbands outside of the respective receive frequency band and transmit frequency band. However, these filters have finite stop band attenuation, and a small amount of undesired signal energy may effectively leak through the filters. In addition, when the transmit filter 120 and the receive filter 110 are combined within a common package 130 to form the duplexer 100, there is some undesired coupling of RF energy between the transmit filter 120 and the receive filter 110. This undesired coupling between a transmit filter and a receive filter in a duplexer may be caused by shared components, such as a shared connection to the system ground. Additional undesired coupling between a transmit filter and a receive filter may also be due to parasitic components. Every element and every conductor in a duplexer is linked to every other element by a stray or parasitic capacitance, and every current-carrying conductor is linked to every other current-carrying conductor by a parasitic mutual inductance (with the exception of pairs of conductors where the direction of current flow is orthogonal). Individually, the value of each of the parasitic capacitances and inductances may be extremely small. Collectively, the signals that leak though the filters due to finite stop band attenuation and signals resulting from undesired coupling will be referred to herein as "RF signal leakage." RF signal leakage limits the Tx port to Rx port isolation of a duplexer. RF signal leakage is represented in FIG. 1 by the dashed arrow 140.

Figure 2:
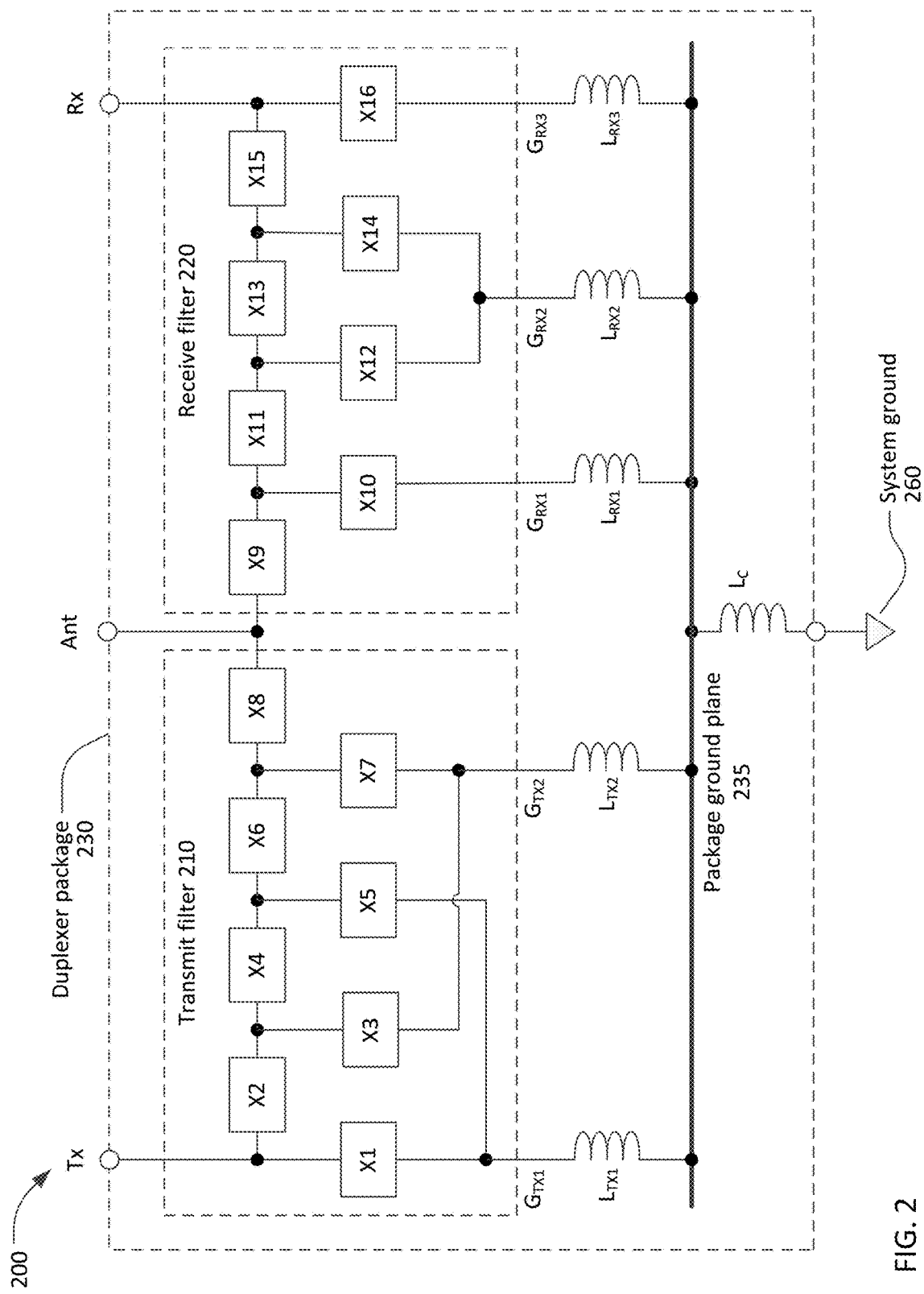
FIG. 2 is a schematic diagram of an exemplary duplexer using resonators.

Referring now to FIG. 2, an exemplary conventional duplexer 200 includes a transmit filter 210 and a receive filter 220, each of which include eight resonators, labeled X1 through X16. The use of sixteen resonators is exemplary and a duplexer or other filter circuit may include more or fewer than sixteen resonators. The resonators may be acoustic resonators, such as surface acoustic wave (SAW) resonators, bulk acoustic wave (BAW) resonators, and film bulk acoustic wave (FBAR) resonators. The resonators may be microelectromechanical system (MEMS) resonators or some other form of mechanical resonator.

The transmit filter 210 and the receive filter 220 may be a single device, or may be two physically separate devices. In either case, the transmit filter 210 and the receive filter 220 are mounted with a common duplexer package 230.

In the duplexer 200, resonators X2, X4, X6, X8, X9, X11, X13, and X15 may be referred to as "series resonators" since these eight resonators are connected in series between the Rx and Tx ports of the filter circuit. Resonators X1, X3, X5, X7 X10, X12, X14, and X16 may be referred to as "shunt resonators" since these eight resonators are each connected from either a node between two series resonators or one of the signal ports (Tx, Rx, or Ant) and one of several ground terminals ($G_{RX1}$, $G_{RX2}$, $G_{RX3}$, $G_{TX1}$, $G_{TX2}$) on the filter devices (and thus "shunt" some radio frequency energy towards ground). In this example, there are three receive ground terminals $G_{RX1}$, $G_{RX2}$, $G_{RX3}$ and two transmit ground terminals $G_{TX1}$, $G_{TX2}$. A duplexer may have more or fewer than two or three ground terminals for each of the receive filter 220 and the transmit filter 210.

However, the ground terminals ($G_{RX1}$, $G_{RX2}$, $G_{RX2}$, $G_{TX1}$, $G_{TX2}$) on the transmit and receive filter devices 210, 220 are not actually "ground" (i.e. held at zero volts). These ground terminals interconnect, typically by means of respective solder bumps, with a corresponding ground conductor on a circuit board within the duplexer package 230. The ground conductors within the duplexer package 230 then interconnect with a package ground plane 235. The package ground plane 235 interconnects with a system ground 260 external to the filter package. At the frequency of operation of the duplexer 200 (1.85 GHz to 1.99 GHz), the interconnections and circuit board conductors are not insignificant elements. The interconnections and conductors are primarily inductive at the frequency of operation and are shown in FIG. 2 as ground inductors $L_{RX1}$, $L_{RX2}$, $L_{RX3}$, $L_{TX1}$, $L_{TX2}$. Although FIG. 2 depicts the ground inductors $L_{RX1}$, $L_{RX2}$, $L_{RX3}$, $L_{TX1}$, $L_{TX2}$ as part of the filter package 230, the ground inductors are actually distributed between the package and the filters 210, 220. Additionally, the interconnection between the package ground plane 235 and the system ground 260 forms a common (i.e. common to both the transmit filter and the receive filter) inductance $L_C$.

The interconnections and circuit traces between the filters 210, 220 and the system external to the duplexer 200 also add inductances in series with the Rx, Ant, and Tx ports of the duplexer 200. These inductances (not shown in FIG. 2) have less effect on the isolation between the Tx and Rx ports than the ground inductors $L_{RX1}$, $L_{RX2}$, $L_{RX3}$, $L_{TX1}$, $L_{TX2}$ and the common inductor $L_C$.

Figure 3B:
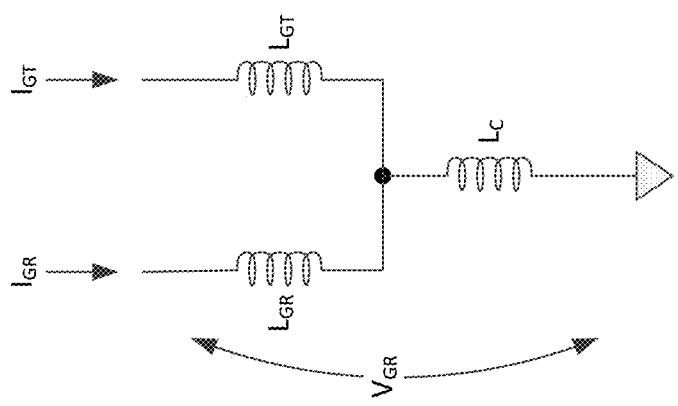
FIG. 3B is a circuit diagram illustrating cancellation of a shared ground inductance.
Figure 3A:
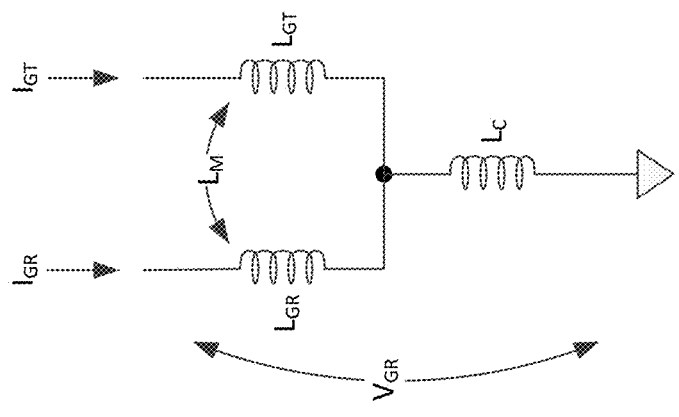
FIG. 3A is a circuit diagram illustrating coupling caused by shared ground inductance.

FIG. 3A is a schematic diagram illustrating the RF signal leakage that occurs between a transmit filter and a receive filter in a duplexer because of ground inductances. In this circuit, $I_{GR}$ is the current flowing from a receive filter ground terminal and $I_{GT}$ is the current flowing from a transmit filter ground terminal. $L_{GR}$ is the series inductance in the receiver ground terminal, $L_{GT}$ is the series inductance in the transmit filter ground terminal, and $L_C$ is the common inductance between the package ground plane and the system ground external to the package. As shown in the formula below the schematic diagram, the voltage $V_{GR}$ (the voltage at the receive filter ground terminal with respect to the system ground) is dependent, in part, on $I_{GT}$, the current flowing from a transmit filter ground terminal. Thus the common ground inductor LC will couple RF energy between the transmit filter and the receive filter in a duplexer.

FIG. 3B is a schematic diagram illustrating the use of coupled inductors to offset or cancel the coupling between the transmit filter and receive filter in a duplexer due to a common ground inductor. In this application, the term "coupled inductors" specifically means two or more inductors that are electromagnetically coupled such that a current in any one of the inductors does not flow through the other inductors but does induce a voltage in the other inductors. The subsequent examples illustrate the use of two coupled inductors. Coupling three or more inductors to cancel RF signal leakage is possible in principle and may be appropriate in some circumstances.

In FIG. 3B, $I_{GR}$ is the current flowing from a receive filter ground terminal and $I_{GT}$ is the current flowing from a transmit filter ground terminal. $L_{GR}$ is the series inductance in the receiver ground terminal, $L_{GT}$ is the series inductance in the transmit filter ground terminal, and $L_C$ is the common inductance between the package ground plane and the system ground external to the package. The difference between the circuit of FIG. 3B and the circuit of FIG. 3A is that, in FIG. 3B the inductors $L_{GR}$ and $L_{GT}$ are electromagnetically coupled such that there is a mutual inductance $L_M$ between $L_{GR}$ and $L_{GT}$. Depending on the physical arrangement of $L_{GR}$ and $L_{GT}$, the mutual inductance $L_M$ may be positive or negative. As shown in the formula below the schematic diagram, the voltage $V_{GR}$ (the voltage at the receive filter ground terminal with respect to the system ground) can be independent of $I_{GT}$ if $L_M = -L_C$. The use of properly configured coupled inductors can reduce or cancel the coupling between the transmit and receive filters caused by the common ground inductance $L_C$.

Figure 4C:
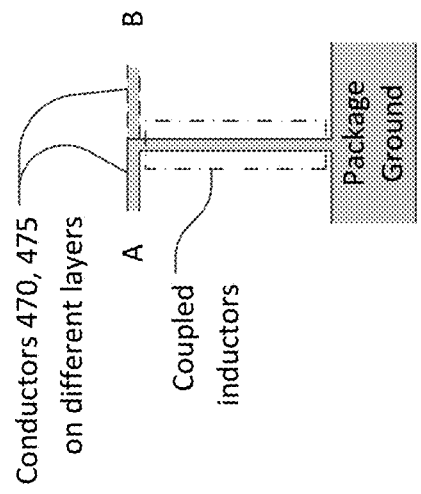
FIG. 4C is a plan view of coupled inductors implemented by overlapping parallel conductors on two layers of a circuit board.
Figure 4B:
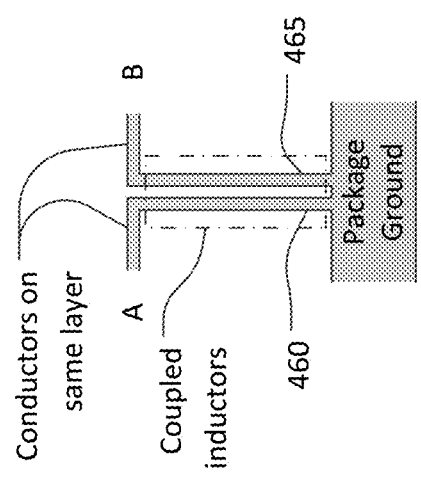
FIG. 4B is a plan view of coupled inductors implemented by parallel conductors on a circuit board.
Figure 4A:
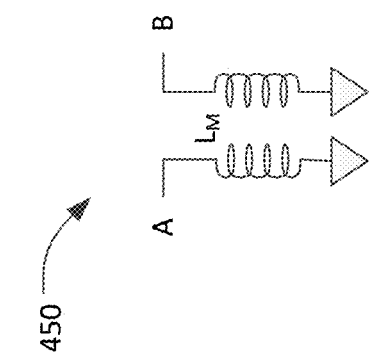
FIG. 4A is a schematic diagram of coupled inductors.

FIG. 4A is a schematic diagram of coupled inductors 450 that convey an RF signal between two nodes A, B. For example, node A may be internal to, or connected to, a receive filter and node B may be internal to, or connected to, a transmit filter in a duplexer. Although the standard circuit diagram symbol for an inductor resembles a coil of wire, actual coils are not required at the frequency of operation of microwave RF filters. FIG. 4B illustrates coupled inductors implemented as two parallel conductors 460, 465 on a circuit card, which may be, for example, a circuit card within a duplexer package. The mutual inductance between the coupled inductors is roughly proportional to the length of the parallel conductors 460, 465 and inversely dependent on the spacing between the two conductors. FIG. 4C illustrates coupled inductors implemented as two overlapping parallel conductors 470, 475 formed on two different conductor layers of a circuit card. Since the overlapping conductors 470, 475 may be closer together than the conductors 460, 465 of FIG. 4B, the configuration of FIG. 4C may provide higher mutual inductance for a given length of the parallel conductors.

Figure 5A:
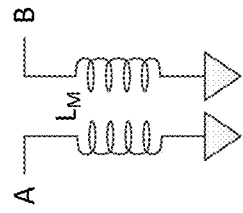
FIG. 5A to FIG. 5F are schematic diagrams of different circuits including coupled inductors.
Figure 5B:
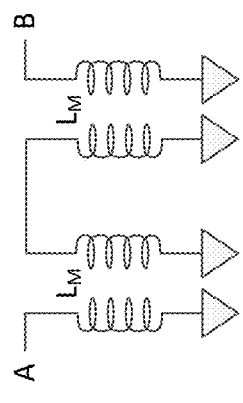

FIG. 5A is a schematic diagram, as previously shown in FIG. 4A, of coupled inductors that convey an RF signal between two nodes A, B. For example, node A may be part of, or connected to, a receive filter and node B may be part of, or connected to, a transmit filter in a duplexer. FIG. 5B is a schematic diagram of a similar circuit to FIG. 5A, but with the connections to one of the coupled inductors reversed. The RF signal coupled from node A to node B by the circuit of FIG. 5B has a 180-degree phase shift compared to the signal coupled from node A to node B by the circuit of FIG. 5A.

Figure 5C:
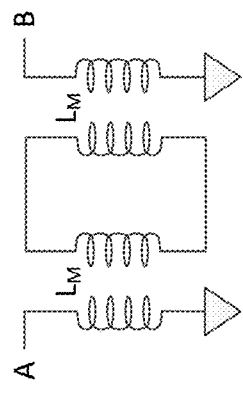
Figure 5E:
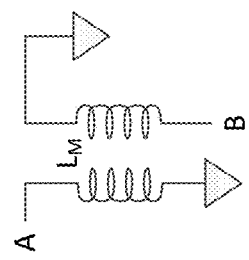
Figure 5D:
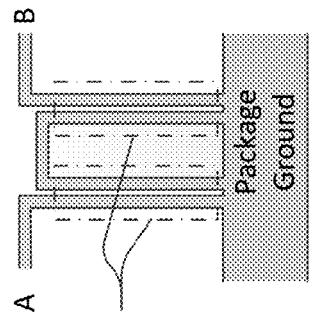
Figure 5F:
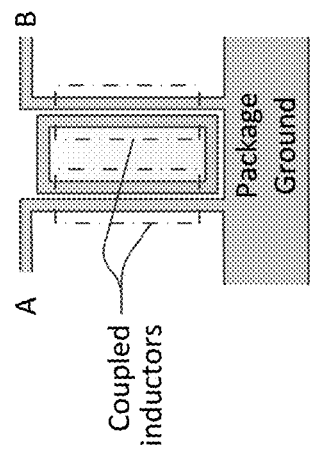

FIG. 5C and FIG. 5E are schematic diagrams of circuits using cascaded coupled inductors to convey an RF signal between two nodes A, B. The circuits of FIG. 5C and FIG. 5E may be used, for example, if the nodes A and B are widely separated on a circuit board within a duplexer package. FIG. 5D and FIG. 5F are plan views of the circuits of FIG. 5C and FIG. 5E, respectively, implemented by parallel conductors on a single layer of a circuit board. Higher mutual inductance may be achieved if the circuits of FIG. 5C and FIG. 5E are implemented using overlapping conductors on two or more layers of the circuit card, as shown in FIG. 4C. Reversing the connection on any one inductor in FIG. 5C or FIG. 5E will shift the phase of the coupled signal by 180 degrees.

Figure 6:
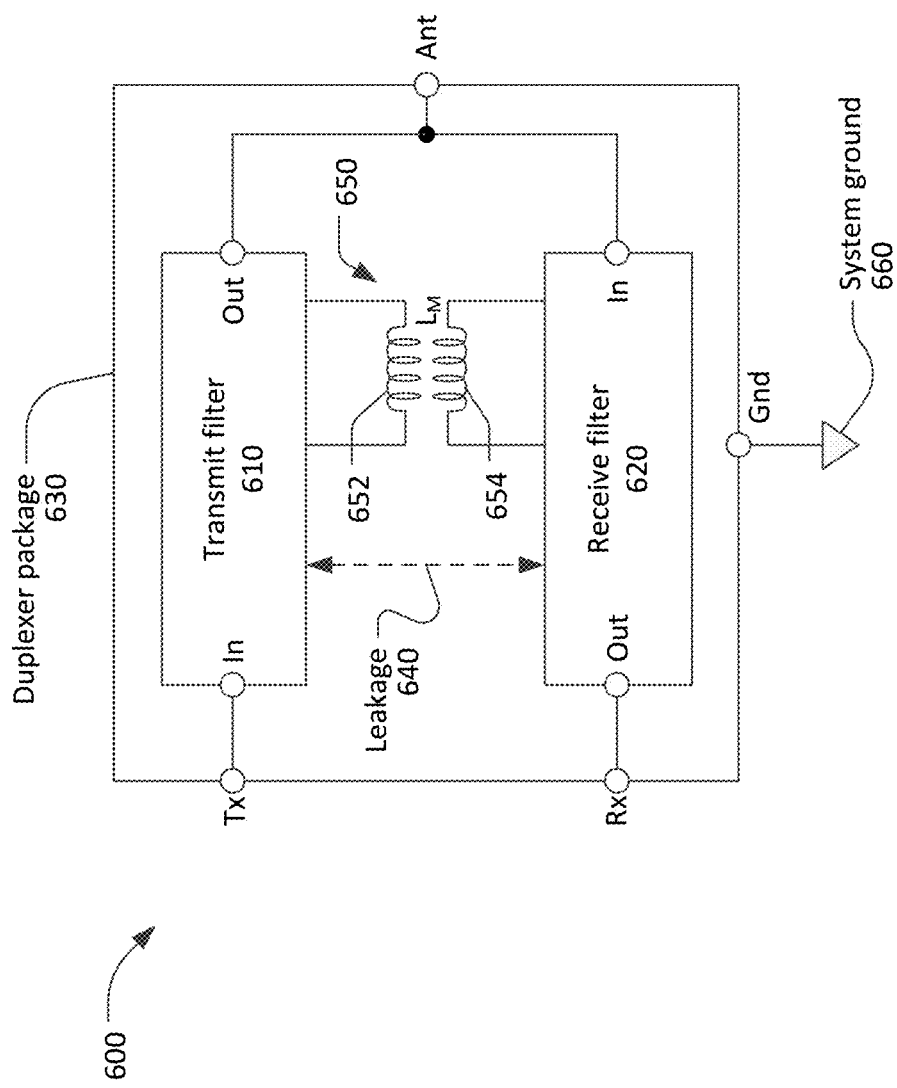
FIG. 6 is a block diagram of a duplexer using coupled inductors to enhance isolation.

Referring now to FIG. 6, a duplexer 600 includes a transmit filter 610 and a receive filter 620. The transmit filter 610 and the receive filter 620 may be a single device or may be two physically separate devices. In either case, the transmit filter 610 and the receive filter 620 are mounted within a common duplexer package 630. The function of the transmit and receive filters 610, 620 may be the same or comparable to the transmit and receive filters 110, 120 of the duplexer 100 of FIG. 1.

There is some RF signal leakage between the transmit filter 610 and the receive filter 620, as represented by the dashed arrow 640. A previously discussed, this RF signal leakage may be caused by finite stop-band attenuation in the filters 610, 620, by shared components, such as a shared connection to the system ground, and/or by parasitic components. The arrow 640 represents the cumulative effect of a plurality of RF signals coupled between the transmit filter 610 and the receive filter 620 by a variety of mechanisms.

In contrast to the duplexer 100, the duplexer 600 also includes coupled inductors 650. The coupled inductors 650 include a first inductor 652 that is part of, or connected to, the transmit filter 610 and a second inductor 654 that is part of, or connected to, the receive filter 620. Each inductor 652, 654 is a two-terminal component. In this context, an inductor is considered "connected to" a filter if either or both terminals of the inductor are electrically connected to the input, output, or any internal node of the filter. The inductors 652, 654 are coupled, which is to say there is a mutual inductance $L_M$ between inductors 652, 654. The coupled inductors 650 are configured to convey an RF signal between the transmit filter 610 and the receive filter 620 to cancel, at least in part, the RF signal leakage represented by the arrow 640. Ideally, the signal conveyed by the coupled inductors 650 will have the same amplitude and inverse phase of the RF signal leakage represented by the arrow 640. In this ideal case, the signal conveyed by the coupled inductors 650 will cancel the RF signal leakage 640, resulting in a substantial improvement in isolation between the Tx and Rx ports of the duplexer. In practice, the coupled inductors 650 may result in partial cancellation of the RF signal leakage 640 over at least a portion of the transmit band and/or receive band of the duplexer 600.

Figure 7:
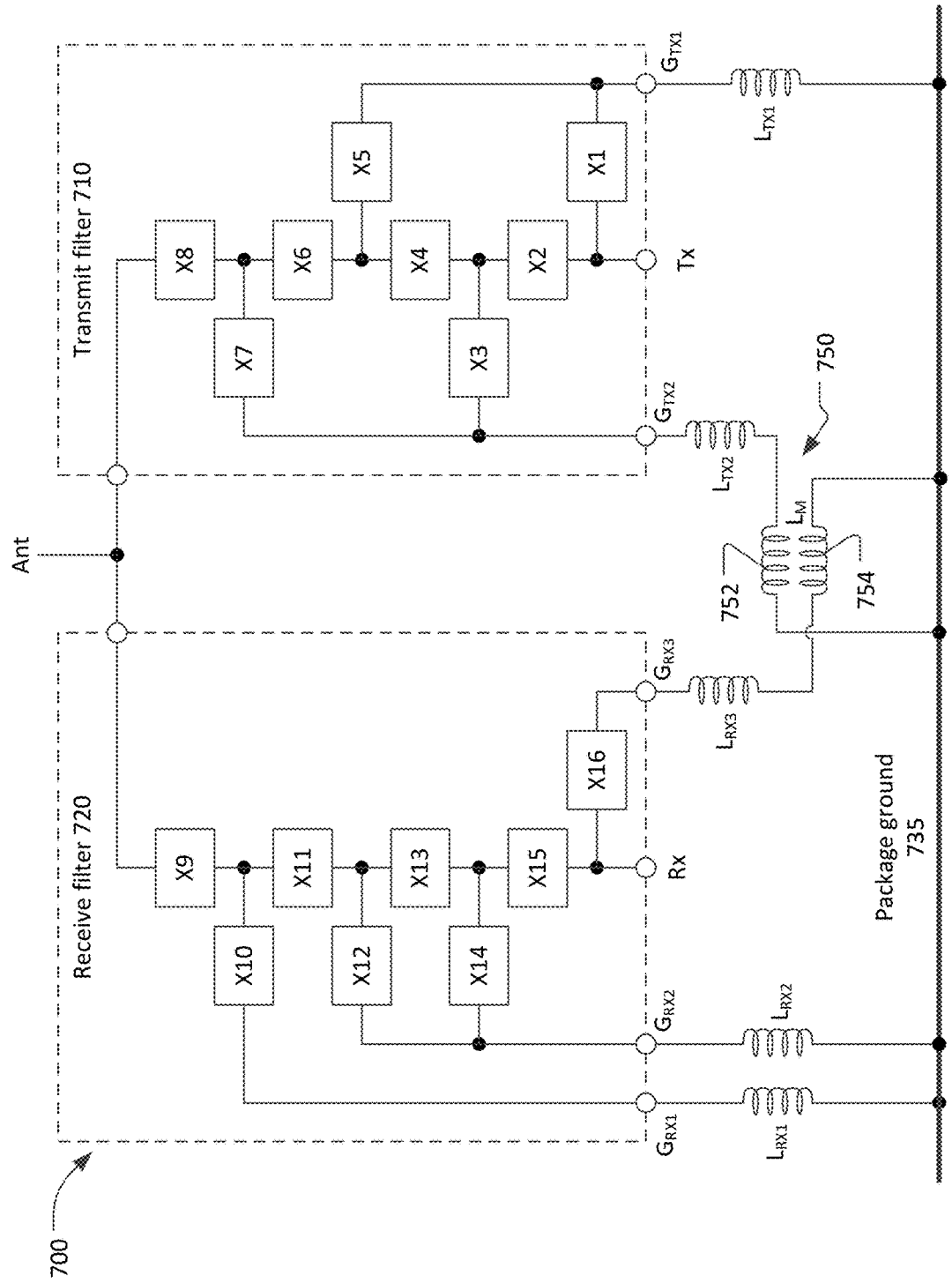
FIG. 7 is a schematic diagram of a duplexer using coupled inductors to enhance isolation.

FIG. 7 is a schematic circuit diagram of an exemplary duplexer 700 that incorporates coupled inductors 750 to improve isolation. The duplexer 700 includes a transmit filter 710 and a receive filter 720, each of which include eight resonators, labeled X1 through X16. Although the elements of the duplexer 700 have been arranged differently in the figure, the circuit of the duplexer 700 is the same as the duplexer 200 of FIG. 2, with the addition of the coupled inductors 750 in the circuit paths from $G_{RX3}$ and $G_{TX2}$ to the package ground plane 735.

The coupled inductors 750 include a first inductor 752 connected between transmit ground terminal $G_{TX2}$ (via inductor $L_{TX2}$) and the package ground 735. The coupled inductors 750 includes a second inductor 754 connected between receive ground terminal $G_{RX3}$ (via inductor $L_{RX3}$) and the package ground 735.

Figure 8:
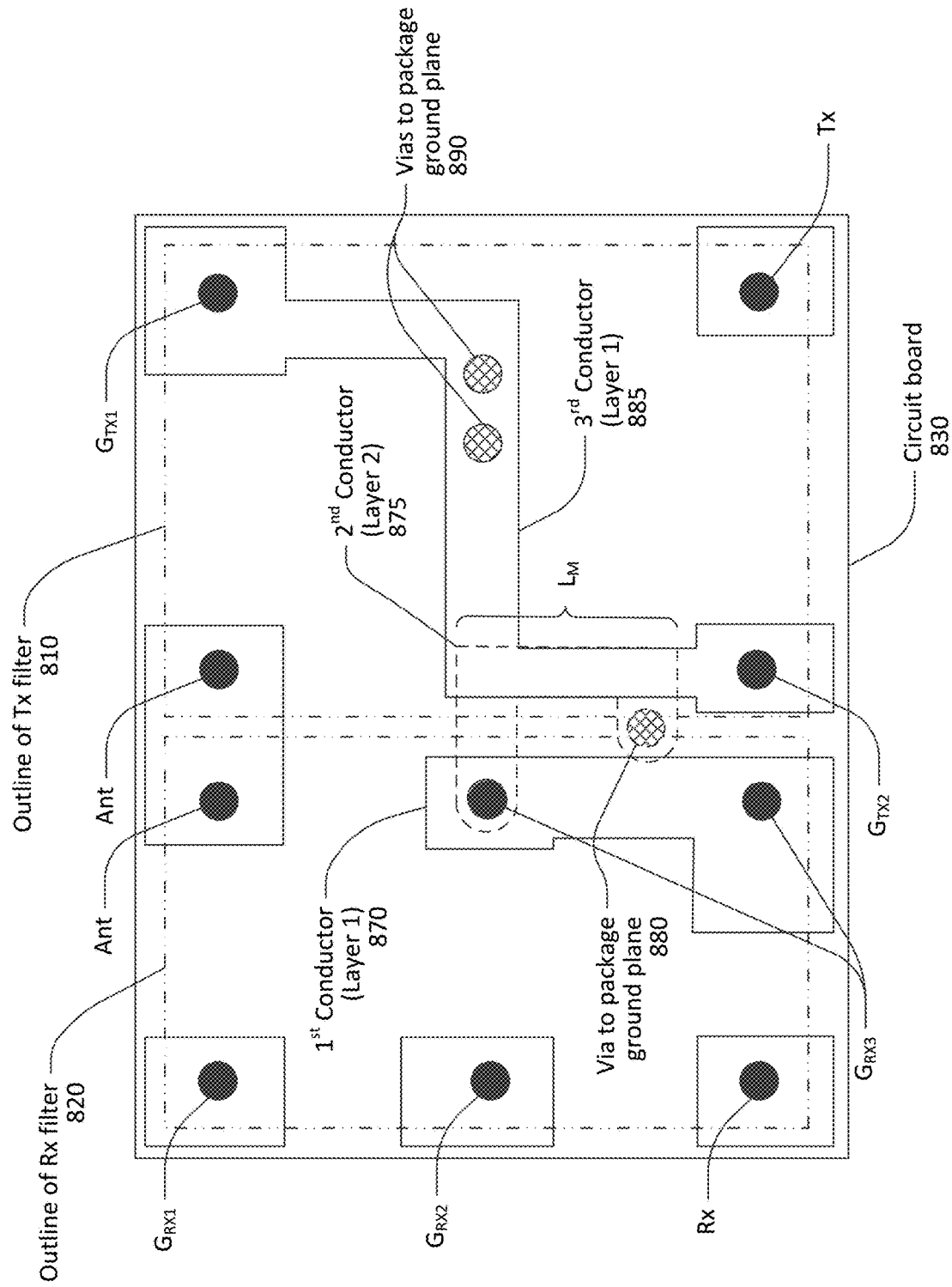
FIG. 8 is a schematic plan view of a package for the duplexer of FIG. 7.

FIG. 8 is a plan view of a circuit board 830 that may be used to interconnect the transmit filter 710 and the receive filter 720 of the duplexer 700. Although the filter devices 710, 720 are not shown in FIG. 8, the location of each filter device is indicated by the corresponding outline 810, 820. The circuit board 830 includes a substrate (not identified separately) supporting at least two layers of conductors. The at least two layers of conductors are separated by intervening dielectric layers, with openings in the dielectric layers to allow interconnections, or vias, between conductors on different layers.

Filled circles indicate the location of solder bump connection between the circuit board 830 the filter devices. The receive filter has six solder bump connections to the circuit card 830: (clockwise from the lower left) Rx, $G_{RX2}$, $G_{RX1}$, Ant, and two connections for $G_{RX3}$. The two solder bump connections for $G_{RX3}$ are required for manufacturability (i.e. the process for attaching the filter devices to the substrates prefers a symmetrical arrangement of the solder bumps on the filter device). The two solder bump connections for $G_{RX3}$ are interconnected by a first conductor 870 formed on a first conductor layer (Layer 1) of the circuit board 830. $G_{RX3}$ is connected to a package ground plane by a second conductor 875, which is formed on a second conductor layer (Layer 2) of the circuit card 830, and a via 880.

The transmit filter has four solder bump connections to the circuit card 830: (clockwise from the lower right) Tx, $G_{TX2}$, Ant, $G_{TX1}$. The solder bump connection for $G_{TX2}$ is connected to the package ground plane by a third conductor 885, formed on the first conductor layer (Layer 1) of the circuit board 830, and two vias 890. The third conductor 885 is parallel to and overlaps a portion of the second conductor 875, which is formed on the second conductor layer (Layer 2) of the circuit card 830. The overlapping portions of the second conductor 875 and the third conductor 885 form the coupled inductors 750 having mutual inductance $L_M$.

Figure 9:
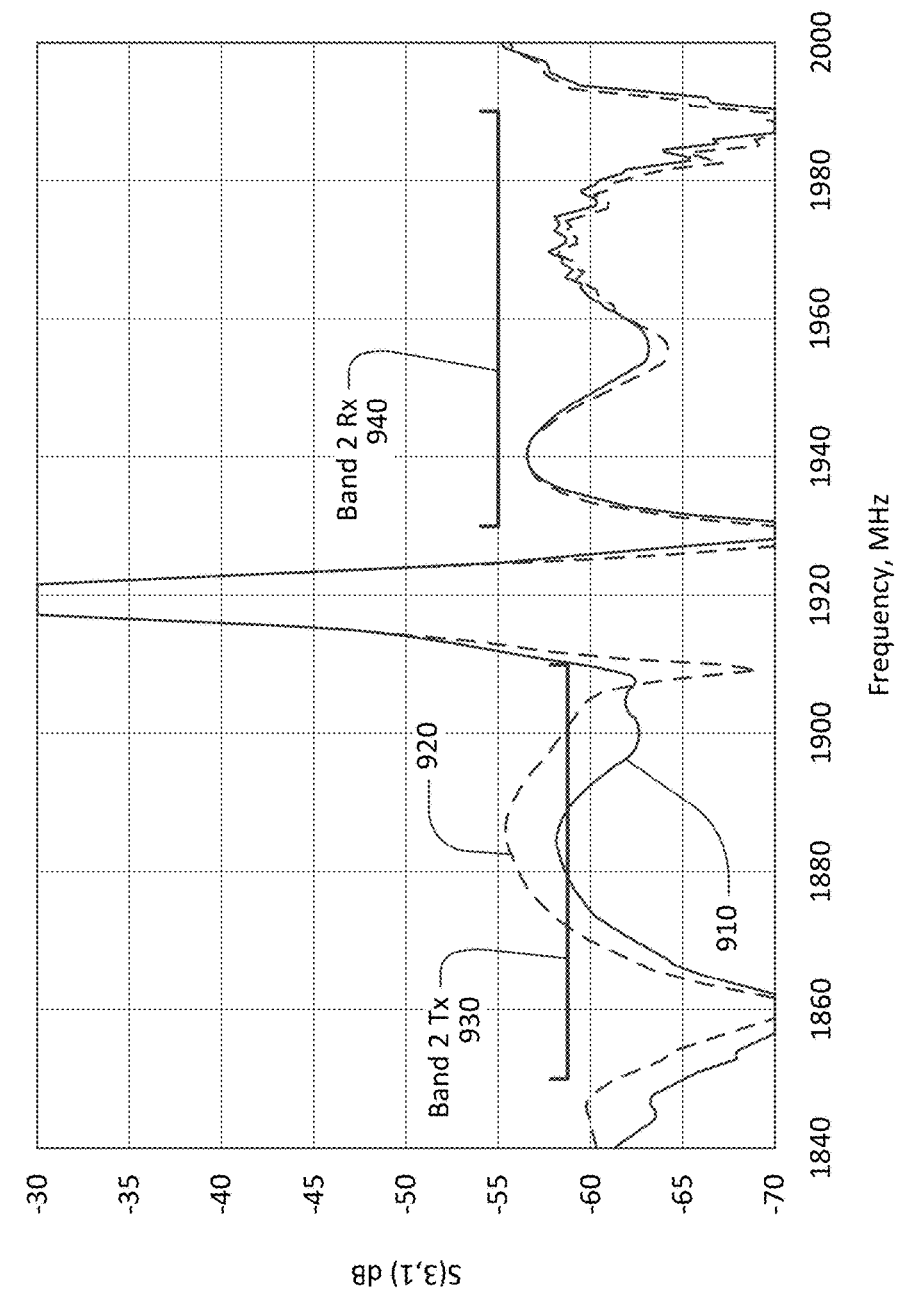
FIG. 9 is a graph comparing the isolation of the duplexer of FIG. 7 and the isolation of a reference duplexer without the coupled inductors.

FIG. 9 is a graph 900 of S(3,1) versus frequency, where S(3,1) is the transmission between the Tx and Rx ports of an LTE® (Long Term Evolution) Band 2 duplexer whose schematic diagram and physical layout were previously shown in FIG. 7 and FIG. 8. S(3,1) is equivalent, except for a change of sign, to the "isolation" between the Tx and Rx ports of the duplexer. A design goal for the duplexer was more than 58 dB isolation (i.e. S(3,1)≤−58 dB) over the Band 2 transmit band from 1850 to 1910 MHz, as indicated by the bracket 930. Another design goal for the duplexer was more than 55 dB isolation (i.e. S(3,1)≤−55 dB) over the Band 2 receive band from 1930 to 1990 MHz, as indicated by the bracket 940. The solid line 910 is a plot of S(3,1) for the duplexer shown in FIG. 7 and FIG. 8. The dashed line 920 is a plot of S(3,1) of a comparable duplexer without the coupled inductors 750. Both plots are derived from simulation of the duplexer rather than physical measurements. The isolation between the Tx and Rx ports over the transmit band is improved when the coupled inductors 750 are present. Specifically, the isolation between the Tx and Rx ports is increased by about 3.5 dB over a portion of the transmit band when the coupled inductors 750 are present. The presence or absence of coupled inductors 750 has little effect on the isolation between the Tx and Rx ports over the receive band.

Figure 10:
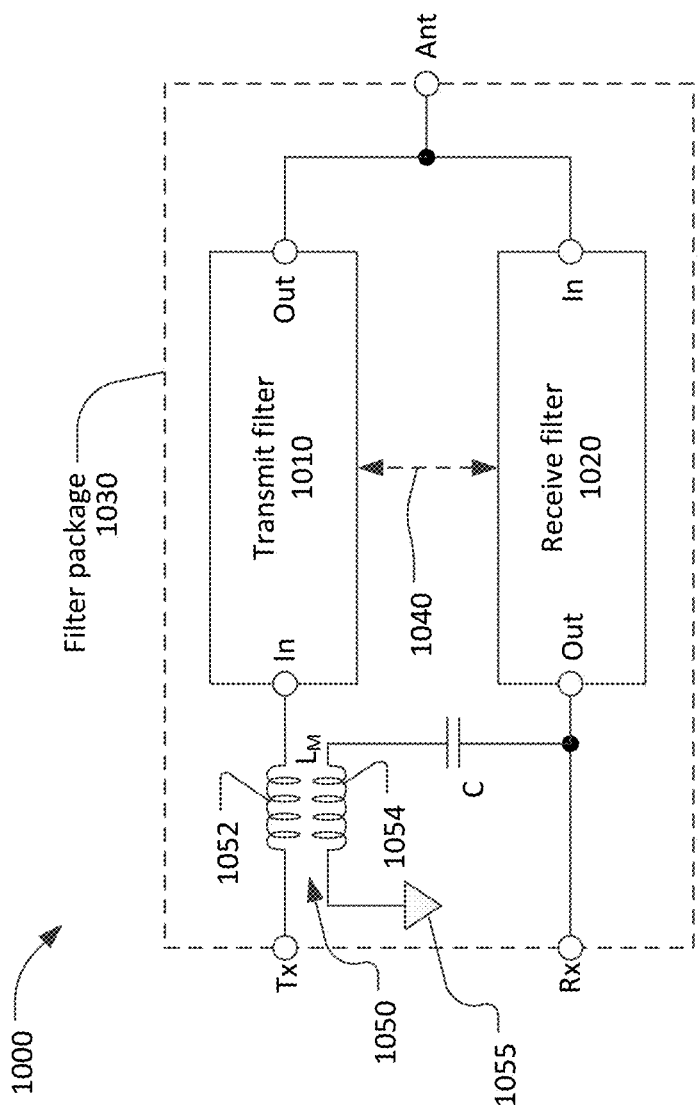
FIG. 10 is a schematic diagram of another duplexer using coupled inductors to enhance isolation.

FIG. 10 is a schematic circuit diagram of an exemplary duplexer 1000 that incorporates coupled inductors 1050 to improve isolation. The duplexer 1000 includes a transmit filter 1010 and a receive filter 1020, each of which may include a plurality of resonators. The transmit filter 1010 and the receive filter 1020 may be a single device or may be two physically separate devices. In either case, the transmit filter 1010 and the receive filter 1020 are mounted within a common duplexer package 1030. The function of the transmit and receive filters 1010, 1020 may be the same or comparable to the transmit and receive filters 110, 120 of the duplexer 100 of FIG. 1.

There is some RF signal leakage between the transmit filter 1010 and the receive filter 1020, as represented by the dashed arrow 1040. As previously discussed, this RF signal leakage may be caused by shared components, such as a shared connection to the system ground and/or parasitic components. The arrow 1040 represents the cumulative effect of a plurality of RF signals coupled between the transmit filter 1010 and the receive filter 1020 by a variety of mechanisms.

Coupled inductors 1050 and a capacitor C are used to convey an RF signal from the Tx input of the duplexer to the Rx output of the duplexer. The coupled inductors 1050 and the capacitor C are configured such that the conveyed signal cancels, at least in part, the RF signal leakage represented by the dashed arrow 1040.

The coupled inductors 1050 include a first inductor 1052 connected between the package transmit terminal Tx and the input (In) of the transmit filter 1010. The coupled inductors 1050 include a second inductor 1054 connected between the package ground 1055 and the output (out) of the receive filter 1020 (via capacitor C).

Figure 11:
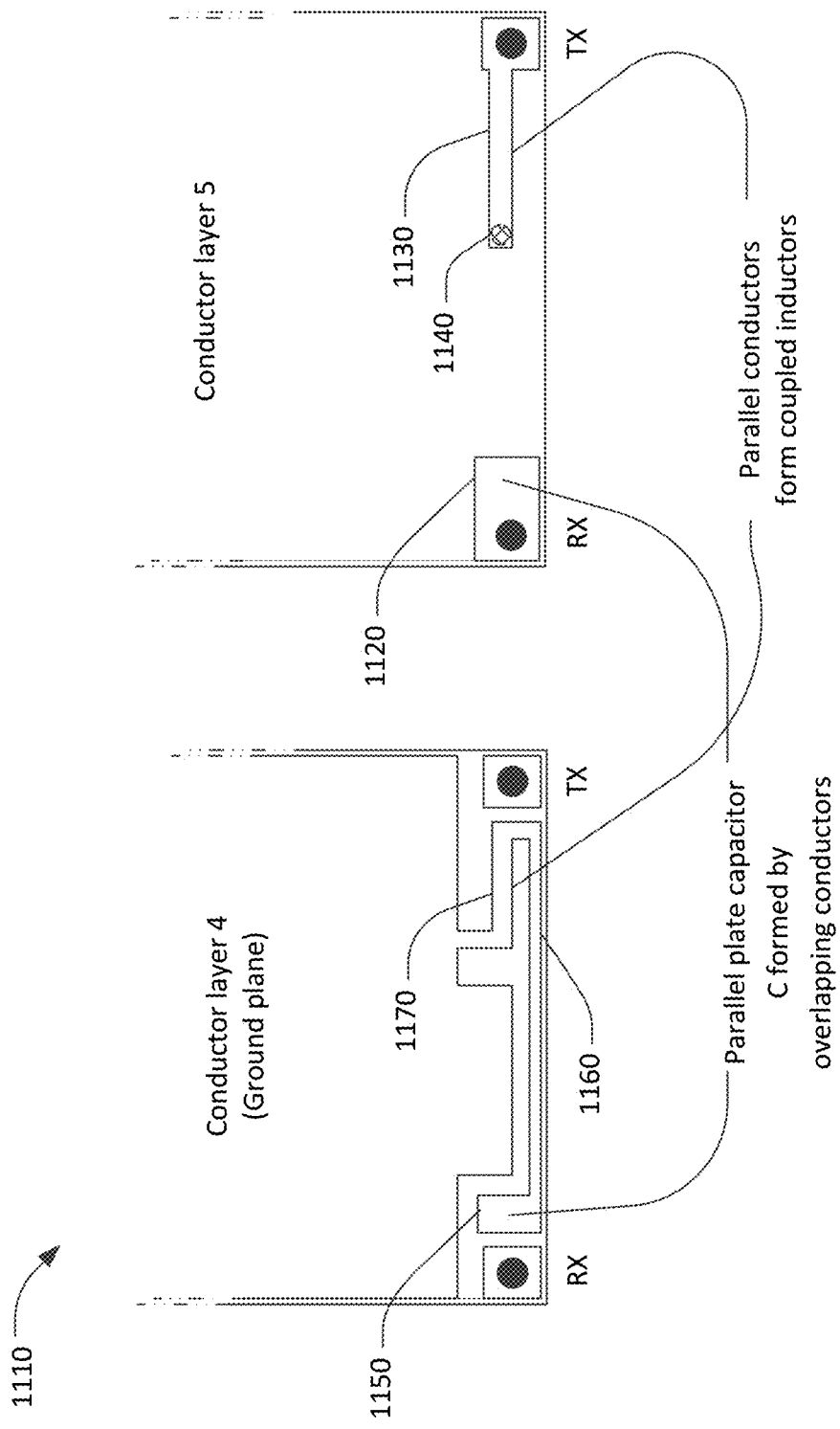
FIG. 11 is a schematic plane view of a package for the duplexer of FIG. 10.

FIG. 11 is a plan view of portions of two layers (identified as "layer 4" and "layer 5") of a circuit board 1110 that may be used to interconnect the transmit filter 1010 and the receive filter 1020 of the duplexer 1000. The circuit board 1110 includes a substrate (not identified separately) supporting five layers of conductors. The five layers of conductors are separated by intervening dielectric layers, with openings in the dielectric layers to allow interconnections, or vias, between conductors on different layers.

Filled circles indicate the location of solder bump connections between the circuit board 1110 and the system external to the duplexer 1000. The transmit filter 1010 and the receive filter 1020 connect to other conductor layers of the circuit board 1110 using additional solder bump connections (not shown).

On conductor layer 5, the Rx output of the duplexer 1000 connects to a rectangular conductor 1120. The Rx output of the duplexer also connects to the Rx terminal of the receive filter 1020 by means of conductors on other layers of the circuit card 1110 (not shown). Also on conductor layer 5, the Tx input of the duplexer connects to a via 1140 by means of a conductor 1130. The via 1140 connects to the Tx terminal of the transmit filter 1010 by means of conductors on other layers of the circuit card 1110 (not shown).

On conductor layer 4, a rectangular conductor 1150 overlays the conductor 1120 on conductor layer 5. The conductor 1120, the conductor 1150, and the intervening dielectric layer form a parallel plate capacitor (capacitor C in FIG. 10). The rectangular conductor 1150 connects to the package ground plane via conductor 1160 and conductor 1170. Conductor 1170 is parallel to and overlays conductor 1130 on conductor layer 4. The conductors 1130 and 1170 form the coupled inductor 1050 in FIG. 10.

Figure 12:
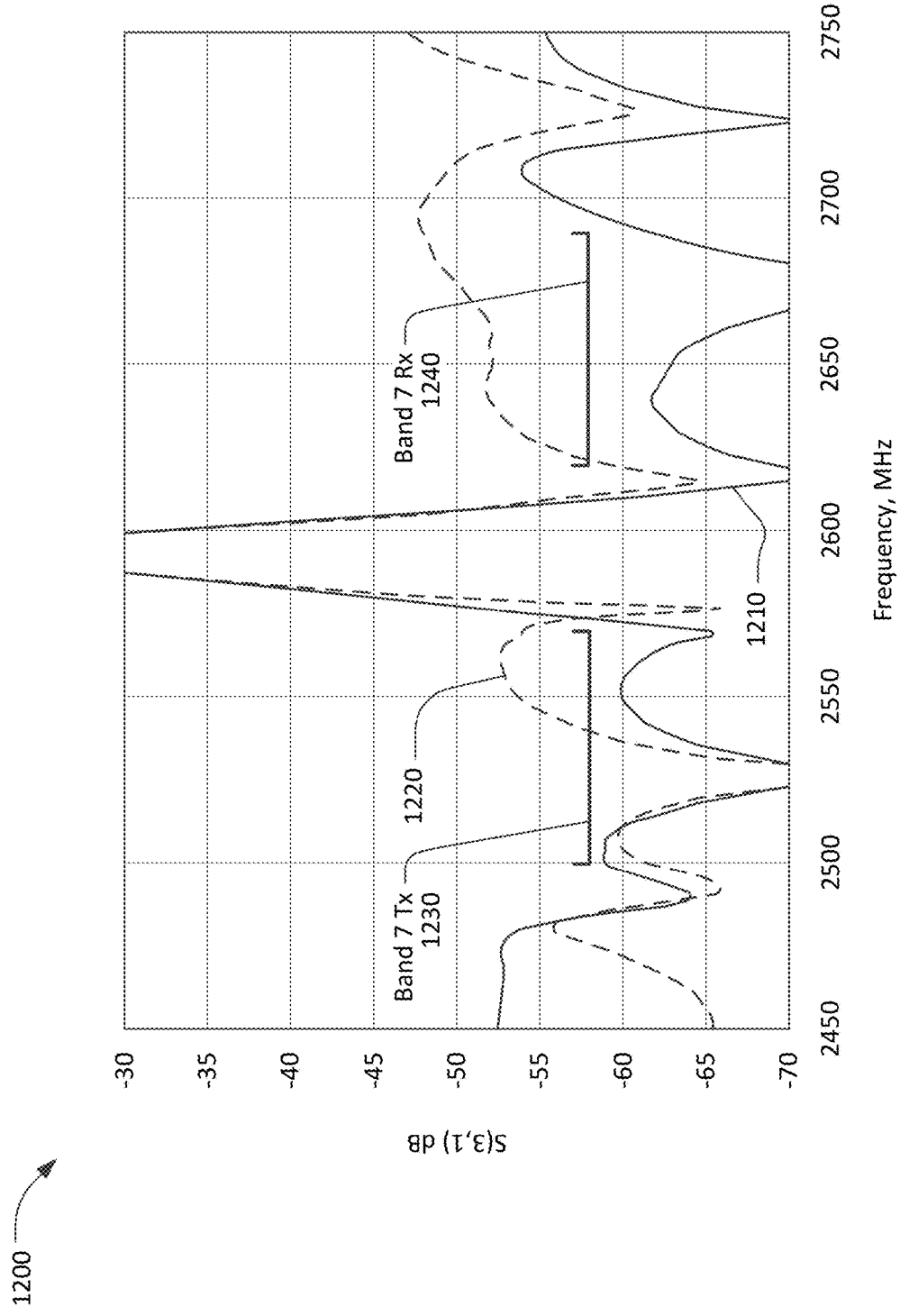
FIG. 12 is a graph comparing the isolation of the duplexer of FIG. 10 and the isolation of a reference duplexer without the coupled inductors.

FIG. 12 is a graph 1200 of S(3,1) versus frequency, where S(3,1) is the transmission between the Tx and Rx ports, of an LTE® (Long Term Evolution) Band 7 duplexer whose schematic diagram and physical layout were previously shown in FIG. 10 and FIG. 11. S(3,1) is equivalent, except for a change of sign, to the "isolation" between the Tx and Rx ports of the duplexer. A design goal for the duplexer was more than 58 dB isolation (i.e. S(3,1)≤−58 dB) over the Band 7 transmit band from 2500 to 2570 MHz, as indicated by the bracket 1230. Another design goal for the duplexer was more than 58 dB isolation (i.e. S(3,1)≤−58 dB) over the Band 7 receive band from 2620 to 2690 MHz, as indicated by the bracket 1240. The solid line 1210 is a plot of S(3,1) for the duplexer shown in FIG. 10 and FIG. 11. The dashed line 1220 is a plot of S(3,1) of a comparable duplexer without the coupled inductors 1050. Both plots are derived from simulation of the duplexer. The isolation between the Tx and Rx ports over the transmit band is improved when the coupled inductors 1050 are present. Specifically, the isolation between the Tx and Rx ports is increased to at least 59 dB over the transmit band and 60 dB over the receive band when the coupled inductors 1050 are present.

Description of Methods

Figure 13:
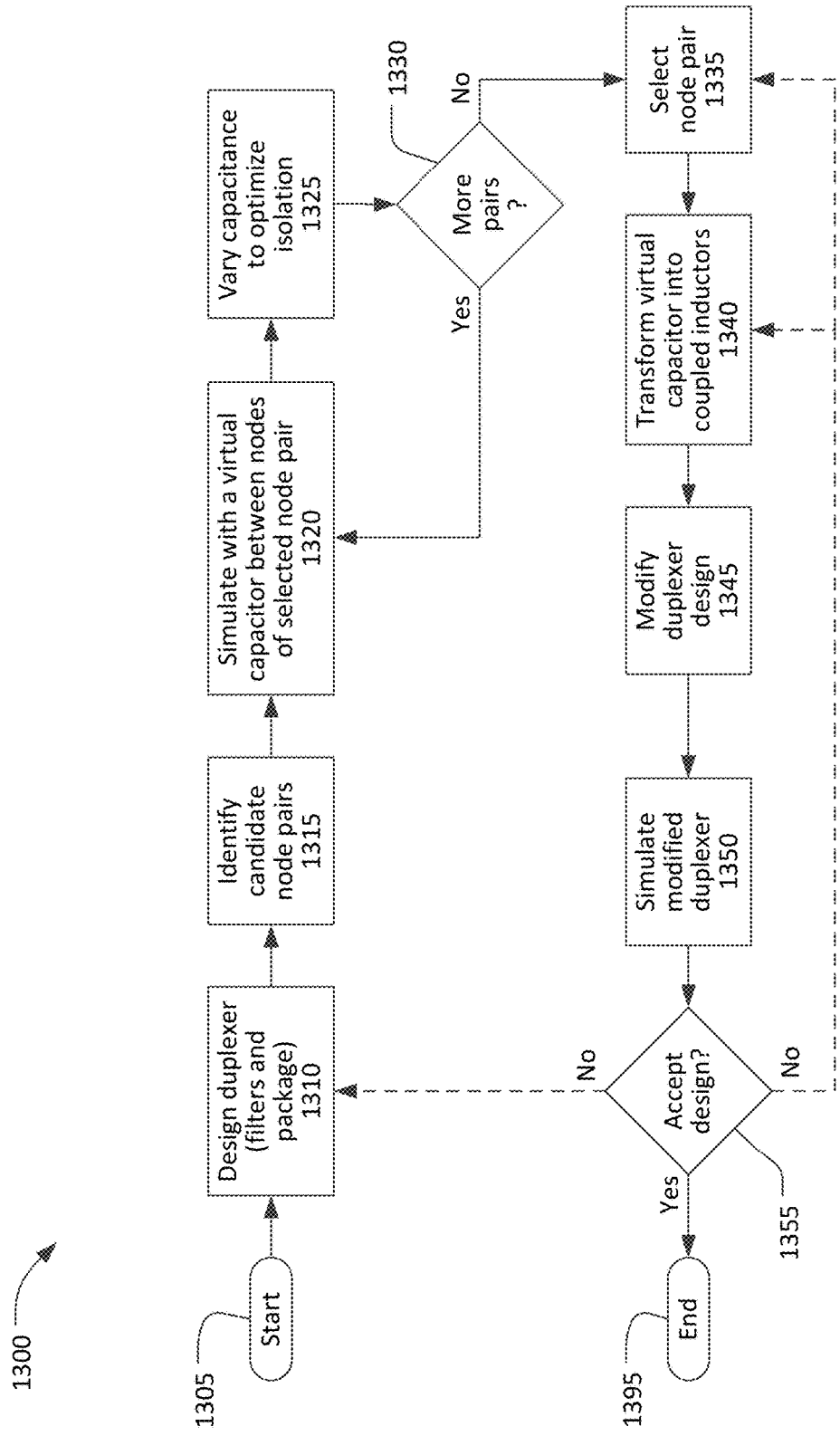
FIG. 13 is a flow chart of a method for designing a duplexer including coupled inductors.

Referring now to FIG. 13, a method 1300 for designing a duplexer starts at 1305 with a set of requirements for a duplexer. The set of requirements includes a requirement for at least a defined minimum isolation between the transmit and receiver ports of the duplexer over one or more defined frequency bands. The method 1300 ends at 1395 with a duplexer design data package suitable for input to a manufacturing process. The design data package at 1395 may include, for example, specifications on the material and processes to be used to manufacture the duplexer and designs for photomasks to produce transmit and receive filters (which may be the same physical device or two separate devices) and a package circuit board.

At 1310 the transmit and receive filters and the package of the duplexer may be designed using conventional methods. The duplexer package typically includes a circuit board with two or more conductor layers. These methods may include the use of a finite element modeling tool and/or a circuit modeling tool. Ideally the design generated at 1310 will meet all of the set of requirements for the duplexer, with the possible exception of isolation in one or more frequency ranges. The subsequent actions in the process 1300 are directed to improving isolation without materially changing other performance parameters of the duplexer designed at 1310.

At 1315, candidate nodes pairs are identified. A candidate node pair may include a node within or connected to the transmit filter and a node within or connected to the receive filter. A node pair may include two nodes within or coupled to the transmit filter or two nodes within or coupled to the receive filter. The two nodes of a node pair must be sufficiently proximate to allow a coupling element to be connected between the two nodes. When the transmit filter and receive filters are separate devices fabricated on separate piezoelectric chips, each candidate node pair will consist of nodes located on the circuit board within the package. When the transmit and receive filters are fabricated on a common piezoelectric chip, each candidate node pair will consist of either two nodes located on the piezoelectric chip, or two nodes located on the package circuit board.

At 1320, one of the node pairs identified at 1320 is selected and a simulation of the duplexer is performed with a virtual capacitor connected between the two nodes of the selected node pair. The simulation may be performed using a finite element modeling tool and/or a circuit modeling tool. At 1325, the capacitance of the virtual capacitor is varied within the simulation to optimize the isolation of the duplex over one or more defined frequency bands. The capacitance of the virtual capacitor is not constrained to positive (i.e. physically realizable) values. The optimum capacitance value determined at 1325 may be positive or negative. The actions from 1320-1330 may be repeated ("yes" at 1330) until every node pair identified at 1320 has been considered ("no" at 1330).

At 1335, one of the node pairs from 1315 is selected, based on the simulation results from 1325, for further investigation. For example, the node pair selected at 1335 may be the node pair that resulted in the best isolation with the corresponding optimized virtual capacitor. Alternatively, a node pair may be selected at 1335 based on isolation and other factors.

At 1340, the virtual capacitor between the nodes of the node pair selected at 1360 is converted into coupled inductors designed to provide equivalent coupling between the two nodes of the node pair. An exact capacitor to coupled inductor t transformation does not exist. However, coupled inductors can be configured to be equivalent to a capacitor in the sense that the sign of the coupling is the same, and the magnitude of the coupling is similar over a limited bandwidth.

At 1345. the duplexer design from 1310 is then modified to incorporate the coupled inductors from 1340. Modifying the duplexer design may involve adding or relocating conductors on one or more conductor layers of the circuit board within the duplexer package. In cases where the transmit and receive filters are collocated on a single piezoelectric chip, modifying the design may involve adding or relocating conductors on one or more conductor layers of the chip.

At 1350, the modified duplexer from 1345, which includes the coupled inductors from 1340, is simulated using a finite element modeling tool and/or a circuit modeling tool. At 1355, the simulation results from 1350 are compared to the set of requirements for the duplexer. If the modified design satisfies the set of requirements, the design is accepted ("yes" at 1355) and the process ends at 1395. If the modified design does not satisfy the set of requirements ("no" at 1355), the process 1300 may return to some earlier action at the discretion of the person responsible for the duplexer design. For example, the process may return to 1340 to establish a different configuration for the coupled inductors, or return to 1335 to select a different node pair, or return to 1310 to create a different design for the duplexer (as indicated in FIG. 13 by dashed arrows).

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A duplexer, comprising:
   a duplexer package having a transmit port, an antenna port, a receive port and at least one package ground terminal;
   a transmit filter disposed within the duplexer package;
   a receive filter disposed within the duplexer package; and
   coupled first and second inductors, the first inductor connected to the transmit filter and the second inductor connected to the receive filter, wherein
   the first inductor is connected between the transmit port and the input of the transmit filter,
   the second inductor is connected between the at least one package ground terminal and a first end of a capacitor, a second end of the capacitor connected to the output of the receive filter, and
   the coupled first and second inductors are configured to cancel, at least in part, RF signal leakage between the transmit filter and the receive filter.

2. The duplexer of claim 1, wherein
   an output of the receive filter is connected to the receive port, and
   the coupled first and second inductors are configured to improve isolation between the transmit port and the receive port over at least one of a portion of a transmit frequency band and a portion of a receive frequency band.

3. The duplexer of claim 1, further comprising:
   a circuit board disposed within the duplexer package, wherein
   the coupled first and second inductors are formed on the circuit board.

4. The duplexer of claim 3, wherein the coupled first and second inductors comprise:
   two parallel conductors on a common conductor layer of the circuit board.

5. The duplexer of claim 3, wherein the coupled first and second inductors comprise:
   two overlapping parallel conductors on different conductor layers of the circuit board.

6. The duplexer of claim 1, wherein
   the transmit filter and the receive filter are disposed on a common piezoelectric chip, and
   the first and second coupled inductors comprise two parallel conductors on a common conductor layer of the piezoelectric chip.

7. The duplexer of claim 1, wherein
   the transmit filter and the receive filter are disposed on a common piezoelectric chip, and
   the first and second coupled inductors comprise two parallel conductors on different conductor layers of the piezoelectric chip.

8. A duplexer, comprising:
   a duplexer package having a transmit port, an antenna port, a receive port and at least one package ground terminal;
   a transmit filter disposed within the duplexer package, the transmit filter comprising:
      a transmit filter input, a transmit filter output, and one or more transmit ground terminals,
      one or more series resonators, and
      one or more shunt resonators, each of the one or more shunt resonators connected to one of the one or more transmit ground terminals;
   a receive filter disposed within the duplexer package, the receive filter comprising:
      a receive filter input, a receive filter output, and one or more receive ground terminals,
      one or more series resonators, and
      one or more shunt resonators, each of the one or more shunt resonators connected to one of the one or more receive ground terminals; and
   coupled first and second inductors, the first inductor connected to the transmit filter and the second inductor connected to the receive filter, wherein
   the first inductor is connected between the transmit port and the input of the transmit filter,
   the second inductor is connected between the at least one package ground terminal and a first end of a capacitor, a second end of the capacitor connected to the output of the receive filter, and
   the coupled first and second inductors are configured to cancel, at least in part, RF signal leakage between the transmit filter and the receive filter.

9. The duplexer of claim 8, wherein
   the receive filter output is connected to the receive port, and
   the coupled first and second inductors are configured to improve isolation between the transmit port and the receive port over at least one of a portion of a transmit frequency band and a portion of a receive frequency band.

10. The duplexer of claim 8, further comprising:
    a circuit board disposed within the duplexer package, wherein
    the coupled first and second inductors are formed on the circuit board.

11. The duplexer of claim 10, wherein the coupled first and second inductors comprise:
    two parallel conductors on a common conductor layer of the circuit board.

12. The duplexer of claim 10, wherein the coupled first and second inductors comprise:
    two overlapping parallel conductors on different conductor layers of the circuit board.

13. The duplexer of claim 8, wherein
    the transmit filter and the receive filter are disposed on a common piezoelectric chip, and
    the first and second coupled inductors comprise two parallel conductors on a common conductor layer of the piezoelectric chip.

14. The duplexer of claim 8, wherein
    the transmit filter and the receive filter are disposed on a common piezoelectric chip, and
    the first and second coupled inductors comprise two parallel conductors on different conductor layers of the piezoelectric chip.

* * * * *